US009813813B2

(12) United States Patent
Pierfelice et al.

(10) Patent No.: US 9,813,813 B2
(45) Date of Patent: Nov. 7, 2017

(54) CUSTOMIZATION OF A VEHICLE AUDIO SYSTEM

(71) Applicant: Harman International Industries, Incorporated, Stamford, CT (US)

(72) Inventors: Robert Pierfelice, Belleville, MI (US); Christopher Michael Trestain, Redford, MI (US)

(73) Assignee: Harman International Industries, Incorporated, Stamford, CT (US)

( * ) Notice: Subject to any disclaimer, the term of this patent is extended or adjusted under 35 U.S.C. 154(b) by 87 days.

(21) Appl. No.: 14/841,388

(22) Filed: Aug. 31, 2015

(65) Prior Publication Data

US 2017/0064445 A1  Mar. 2, 2017

(51) Int. Cl.
 *H04R 5/02* (2006.01)
 *H04R 3/04* (2006.01)
 (Continued)

(52) U.S. Cl.
 CPC ............... *H04R 3/04* (2013.01); *H03G 1/02* (2013.01); *H03G 5/165* (2013.01); *H04R 3/02* (2013.01);
 (Continued)

(58) Field of Classification Search
 CPC ........ H04R 3/04; H04R 5/04; H04R 2499/13; H03G 5/165; H04S 3/008
 See application file for complete search history.

(56) References Cited

U.S. PATENT DOCUMENTS 8,422,693 B1 * 4/2013 Daily ................. G01C 21/3629
   381/86
8,442,239 B2 * 5/2013 Bruelle-Drews .... H04B 1/3822
   381/109
(Continued)

FOREIGN PATENT DOCUMENTS

EP     2290813 A1    3/2011
EP     2706662 A2    3/2014
(Continued)

OTHER PUBLICATIONS

"Alpine's Tunelt App," Alpine Electronics Website, Retrieved Online at https://www.alpine.com.au/showPage.php?pid=563, Available as early as Jul. 3, 2014, 3 pages.

(Continued)

*Primary Examiner* — Regina N Holder
(74) *Attorney, Agent, or Firm* — McCoy Russell LLP

(57) ABSTRACT

Embodiments are provided for customizing an audio system of a vehicle. An example computing device for customization of an audio system of a vehicle includes a display configured to present a user interface, a processor, and a storage device storing instructions executable by the processor to generate the user interface for presentation via the display, and receive user input to the user interface requesting one or more adjustments to an audio system, the one or more adjustments including instructions to tune an amplifier of the vehicle by adjusting digital signal processing (DSP) settings of the amplifier. The instructions are further executable to transmit the one or more requested adjustments to a communication interface of the amplifier of the vehicle, the adjusted DSP settings being stored in the amplifier and retrievable by the computing device.

20 Claims, 6 Drawing Sheets

(51) Int. Cl.
*H03G 1/02* (2006.01)
*H04R 3/02* (2006.01)
*H04R 25/00* (2006.01)
*H04S 7/00* (2006.01)
*H03G 5/16* (2006.01)
*H04R 5/04* (2006.01)
*H04S 3/00* (2006.01)

(52) U.S. Cl.
CPC ............ *H04R 5/04* (2013.01); *H04R 25/558* (2013.01); *H04S 3/008* (2013.01); *H04S 7/307* (2013.01); *H04R 2430/01* (2013.01); *H04R 2499/13* (2013.01); *H04S 2400/13* (2013.01)

(56) References Cited

U.S. PATENT DOCUMENTS

| | | | | |
|---|---|---|---|---|
| 2003/0123678 | A1* | 7/2003 | Kemmerer | H04B 1/082 381/86 |
| 2008/0226101 | A1* | 9/2008 | Silber | H04B 1/207 381/123 |
| 2010/0202631 | A1* | 8/2010 | Short | H03G 7/002 381/104 |
| 2014/0207338 | A1 | 7/2014 | Healey et al. | |
| 2014/0244106 | A1* | 8/2014 | Singer | G06F 17/00 701/36 |
| 2015/0160019 | A1* | 6/2015 | Biswal | G01C 21/26 701/1 |
| 2015/0193196 | A1 | 7/2015 | Lin et al. | |
| 2016/0366711 | A1* | 12/2016 | Shanbhag | H04L 69/165 |

FOREIGN PATENT DOCUMENTS

| | | |
|---|---|---|
| WO | 2013032822 A2 | 3/2013 |
| WO | 2014105815 A1 | 7/2014 |

OTHER PUBLICATIONS

"Kenwood Music Control for Android," Kenwood Website, Available Online at http://www2.jvckenwood.com/car/app/kmc1_aapp/eng/, Available as early as Jun. 9, 2015, 3 pages.

Pollard, J., "Sony App Remote; Control Your Stereo with Your Smartphone," Crutchfield Website, Available Online at https://www.crutchfield.com/S-nm4EwOe9J2P/learn/control-your-stereo-with-your-smartphone.html, Available as Early as Jun. 9, 2015, 6 pages.

European Patent Office, Extended European Search Report Issued in Application No. 16186579.5, Jan. 27, 2017, Germany, 10 pages.

* cited by examiner

CUSTOMIZATION OF A VEHICLE AUDIO SYSTEM

FIELD

The disclosure relates to customization of an audio amplifier coupled to a vehicle.

BACKGROUND

Vehicle audio systems are typically tuned to try and overcome the shortcomings of the vehicle's cabin as a quality listening environment. The audio amplifier generally includes a digital signal processor (DSP) enabling the audio system designer control over many parameters affecting the sound system's acoustic output. Typically, the tuning is programmed into the amplifier and users are left with few controls such as bass, treble, balance, and fade to personalize the audio system to their audio tastes.

SUMMARY

Embodiments are provided for customizing an audio system of a vehicle. An example computing device for customization of an audio system of a vehicle includes a display configured to present a user interface, a processor, and a storage device storing instructions executable by the processor to generate the user interface for presentation via the display, and receive user input to the user interface requesting one or more adjustments to an audio system, the one or more adjustments including instructions to tune an amplifier of the vehicle by adjusting digital signal processing (DSP) settings of the amplifier. The instructions are further executable to transmit the one or more requested adjustments to a communication interface of the amplifier of the vehicle, the adjusted DSP settings being stored in the amplifier and retrievable by the computing device.

An example method of tuning an amplifier coupled to a vehicle, the amplifier including a communication interface, includes receiving, at the communication interface of the amplifier, input from a mobile device, the input including an identification of requested adjustments to one or more digital signal processing (DSP) settings of the amplifier, and, responsive to receiving the input from the mobile device, for each requested adjustment to a DSP setting, comparing that requested adjustment to an associated threshold for that DSP setting, and adjusting parameters of an audio signal in accordance with each of the requested adjustments to the one or more DSP settings that are within the associated threshold for that DSP setting to form an adjusted audio signal. The example further includes outputting, from the amplifier, the adjusted audio signal to a plurality of loudspeakers in the vehicle, the adjusted audio signal driving the plurality of loudspeakers, and storing the adjusted DSP settings in the amplifier.

An example in-vehicle computing system for a vehicle includes a vehicle system interface communicatively connected to an amplifier of the vehicle, the amplifier connected to plurality of loudspeakers mounted in the vehicle to drive the plurality of loudspeakers, an external device interface communicatively connected to a mobile device, a processor, and a storage device storing instructions executable by the processor to receive an input from the mobile device to perform a set of requested adjustments to one or more associated DSP settings of the amplifier via the mobile device to tune the amplifier. The instructions are further executable to, for each requested adjustment to an associated DSP setting, comparing that requested adjustment to an associated threshold for that associated DSP setting, and forwarding the requested adjustments to associated DSP settings that are within the associated threshold for that DSP setting to the amplifier, and responsive to determining that one or more of the requested adjustments is not within the threshold for the associated DSP setting, not forwarding the requested adjustments to associated DSP settings that are not within the associated threshold for that DSP setting to the amplifier and transmitting a notice to the mobile device that the requested adjustments that were not within the threshold were not made.

BRIEF DESCRIPTION OF THE DRAWINGS

The disclosure may be better understood from reading the following description of non-limiting embodiments, with reference to the attached drawings, wherein below.

DETAILED DESCRIPTION

As described above, the amplifier in the vehicle audio system is tuned to some preset/factory default parameters. The user may, for example, make minor adjustments to treble, bass, balance, and fade to personalize the audio system to his/her audio tastes through an in-vehicle computing system, for example. However, any additional adjustments such as surround sound, and audio restoration, or adding any filtering such as notch filter, is not possible with adjustments made though the in-vehicle computing system. Additionally, the adjustments available on some audio systems may be bound to a few discreet selectable course levels, without allowing for fine adjustment between the levels.

Accordingly, the disclosure provides a vehicle audio customization system that enables a higher degree of audio adjustment than those typically offered in existing vehicles. A vehicle audio customization system according to the present disclosure may include an amplifier with a wireless (e.g., Bluetooth) transceiver coupled to plurality of loudspeakers, and a mobile device capable of making adjustments to the digital signal processor (DSP) of the amplifier, thus adjusting the amplification of the audio signal fed into the loudspeakers directly. In addition, embodiments for adding speakers to the pillar area to enhance the height of the sound image are provided.

Figure 1:
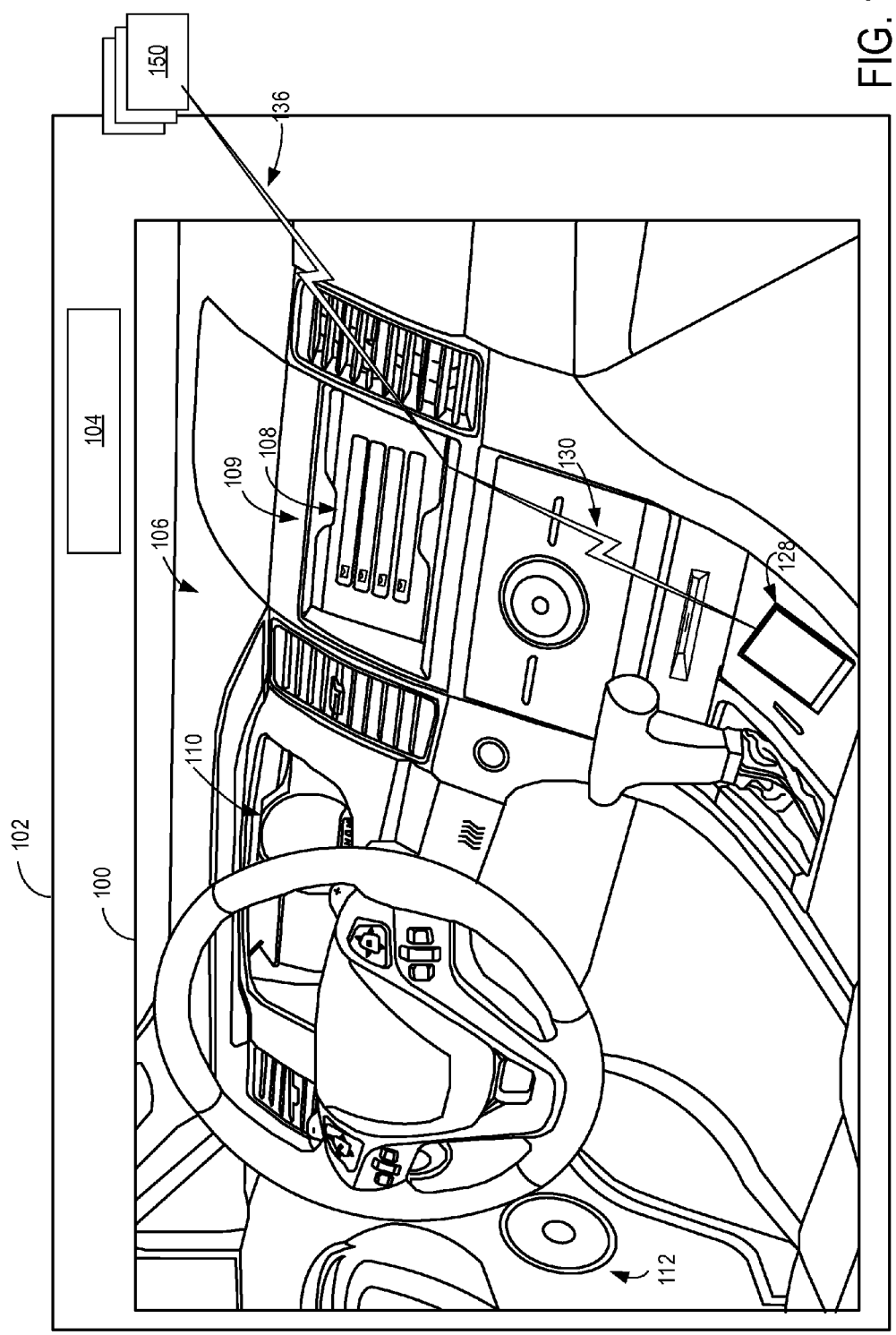
FIG. 1 shows an example partial view of a vehicle cabin in accordance with one or more embodiments of the present disclosure.

FIG. 1 shows an example partial view of one type of environment for an audio customization system: an interior of a cabin 100 of a vehicle 102, in which a driver and/or one or more passengers may be seated. Vehicle 102 of FIG. 1 may be a motor vehicle including drive wheels (not shown) and an internal combustion engine 104. Internal combustion engine 104 may include one or more combustion chambers which may receive intake air via an intake passage and exhaust combustion gases via an exhaust passage. Vehicle 102 may be a road automobile, among other types of vehicles. In some examples, vehicle 102 may include a hybrid propulsion system including an energy conversion device operable to absorb energy from vehicle motion and/or the engine and convert the absorbed energy to an energy form suitable for storage by an energy storage device. Vehicle 102 may include a fully electric vehicle, incorporating fuel cells, solar energy capturing elements, and/or other energy storage systems for powering the vehicle.

As shown, an instrument panel 106 may include various displays and controls accessible to a driver (also referred to as the user) of vehicle 102. For example, instrument panel 106 may include a touch screen 108 of an in-vehicle computing system 109 (e.g., an infotainment system), an audio system control panel, and an instrument cluster 110. While the example system shown in FIG. 1 includes audio system controls that may be performed via a user interface of in-vehicle computing system 109, such as touch screen 108 without a separate audio system control panel, in other embodiments, the vehicle may include an audio system control panel, which may include controls for a conventional vehicle audio system such as a radio, compact disc player, MP3 player, etc. The audio system controls may include features for controlling one or more aspects of audio output via speakers 112 of a vehicle speaker system. For example, the in-vehicle computing system or the audio system controls may control a volume of audio output, a distribution of sound among the individual speakers of the vehicle speaker system, an equalization of audio signals, and/or any other aspect of the audio output. In further examples, in-vehicle computing system 109 may adjust a radio station selection, a playlist selection, a source of audio input (e.g., from radio or CD or MP3), etc., based on user input received directly via touch screen 108, or based on data regarding the user (such as a physical state and/or environment of the user) received via external devices 150 and/or mobile device 128. The audio system of the vehicle may include an amplifier (not shown) coupled to plurality of loudspeakers (not shown). In some embodiments, one or more hardware elements of in-vehicle computing system 109, such as touch screen 108, a display screen, various control dials, knobs and buttons, memory, processor(s), and any interface elements (e.g., connectors or ports) may form an integrated head unit that is installed in instrument panel 106 of the vehicle. The head unit may be fixedly or removably attached in instrument panel 106. In additional or alternative embodiments, one or more hardware elements of the in-vehicle computing system may be modular and may be installed in multiple locations of the vehicle.

The cabin 100 may include one or more sensors for monitoring the vehicle, the user, and/or the environment. For example, the cabin 100 may include one or more seat-mounted pressure sensors configured to measure the pressure applied to the seat to determine the presence of a user, door sensors configured to monitor door activity, humidity sensors to measure the humidity content of the cabin, microphones to receive user input in the form of voice commands, to enable a user to conduct telephone calls, and/or to measure ambient noise in the cabin 100, etc. It is to be understood that the above-described sensors and/or one or more additional or alternative sensors may be positioned in any suitable location of the vehicle. For example, sensors may be positioned in an engine compartment, on an external surface of the vehicle, and/or in other suitable locations for providing information regarding the operation of the vehicle, ambient conditions of the vehicle, a user of the vehicle, etc. Information regarding ambient conditions of the vehicle, vehicle status, or vehicle driver may also be received from sensors external to/separate from the vehicle (that is, not part of the vehicle system), such as sensors coupled to external devices 150 and/or mobile device 128.

Cabin 100 may also include one or more user objects, such as mobile device 128, that are stored in the vehicle before, during, and/or after travelling. The mobile device 128 may include a smart phone, a tablet, a laptop computer, a portable media player, and/or any suitable mobile computing device. The mobile device 128 may be connected to the in-vehicle computing system via communication link 130. The communication link 130 may be wired (e.g., via Universal Serial Bus [USB], Mobile High-Definition Link [MHL], High-Definition Multimedia Interface [HDMI], Ethernet, etc.) or wireless (e.g., via BLUETOOTH, WIFI, WIFI direct, Near-Field Communication [NFC], cellular connectivity, etc.) and configured to provide two-way communication between the mobile device and the in-vehicle computing system. The mobile device 128 may include one or more wireless communication interfaces for connecting to one or more communication links (e.g., one or more of the example communication links described above). The wireless communication interface may include one or more physical devices, such as antenna(s) or port(s) coupled to data lines for carrying transmitted or received data, as well as one or more modules/drivers for operating the physical devices in accordance with other devices in the mobile device. For example, the communication link 130 may provide sensor and/or control signals from various vehicle systems (such as vehicle audio system, climate control system, etc.) and the touch screen 108 to the mobile device 128 and may provide control and/or display signals from the mobile device 128 to the in-vehicle systems and the touch screen 108. The communication link 130 may also provide power to the mobile device 128 from an in-vehicle power source in order to charge an internal battery of the mobile device.

In-vehicle computing system 109 may also be communicatively coupled to additional devices operated and/or accessed by the user but located external to vehicle 102, such as one or more external devices 150. In the depicted embodiment, external devices are located outside of vehicle 102 though it will be appreciated that in alternate embodiments, external devices may be located inside cabin 100. The external devices may include a server computing system, personal computing system, portable electronic device, electronic wrist band, electronic head band, portable music player, electronic activity tracking device, pedometer, smart-watch, GPS system, etc. External devices 150 may be connected to the in-vehicle computing system via communication link 136 which may be wired or wireless, as discussed with reference to communication link 130, and configured to provide two-way communication between the external devices and the in-vehicle computing system. For example, external devices 150 may include one or more sensors and communication link 136 may transmit sensor output from external devices 150 to in-vehicle computing system 109 and touch screen 108. External devices 150 may also store and/or receive information regarding contextual data, user behavior/preferences, operating rules, etc. and may transmit such information from the external devices 150 to in-vehicle computing system 109 and touch screen 108.

In-vehicle computing system 109 may analyze the input received from external devices 150, mobile device 128, and/or other input sources and select settings for various in-vehicle systems (such as climate control system or audio system), provide output via touch screen 108 and/or speakers 112, communicate with mobile device 128 and/or external devices 150, and/or perform other actions based on the assessment. In some embodiments, all or a portion of the assessment may be performed by the mobile device 128 and/or the external devices 150.

In some embodiments, one or more of the external devices 150 may be communicatively coupled to in-vehicle computing system 109 indirectly, via mobile device 128 and/or another of the external devices 150. For example, communication link 136 may communicatively couple external devices 150 to mobile device 128 such that output from external devices 150 is relayed to mobile device 128. Data received from external devices 150 may then be aggregated at mobile device 128 with data collected by mobile device 128, the aggregated data then transmitted to in-vehicle computing system 109 and touch screen 108 via communication link 130. Similar data aggregation may occur at a server system and then transmitted to in-vehicle computing system 109 and touch screen 108 via communication link 136/130.

Figure 2:
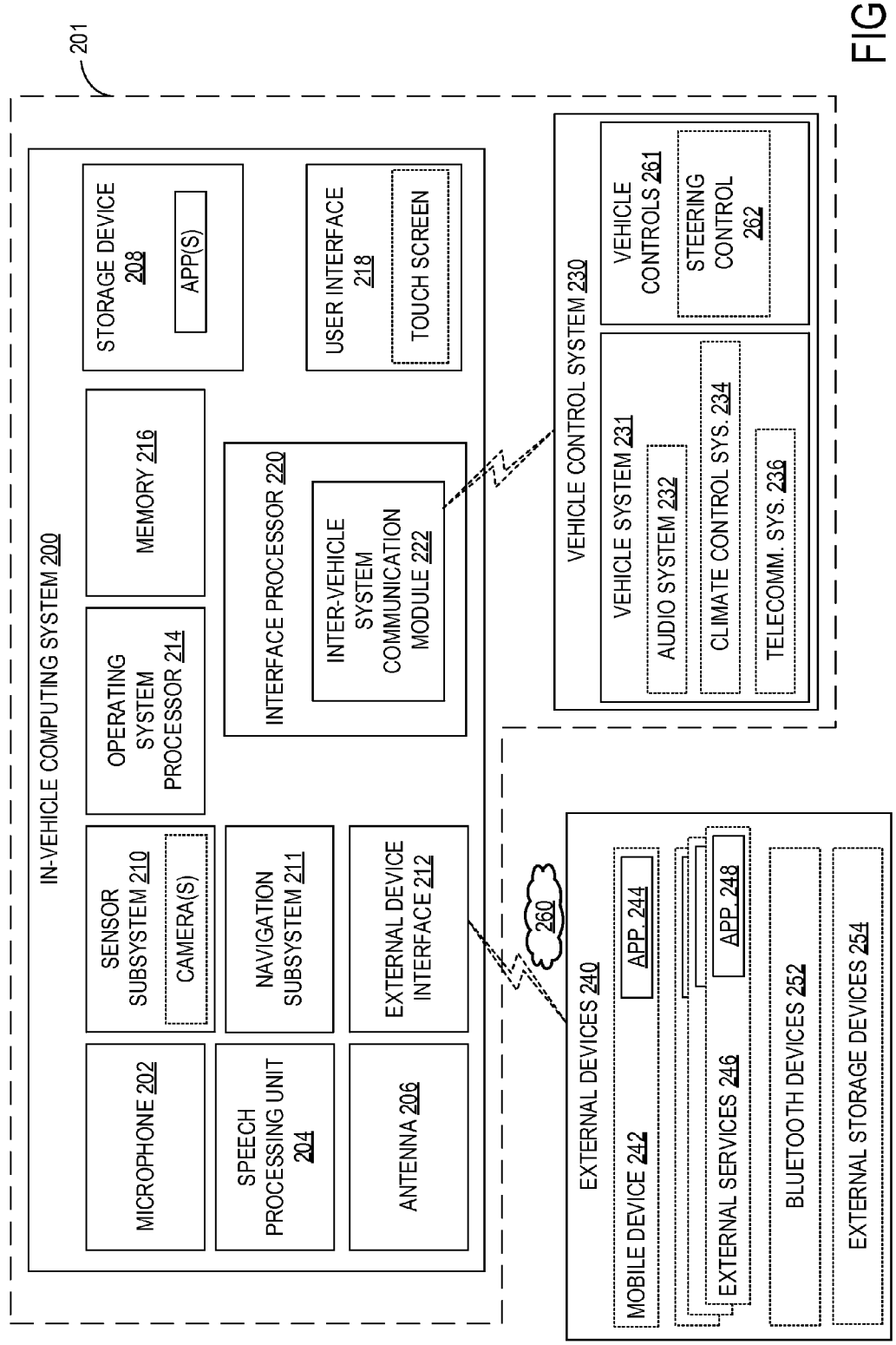
FIG. 2 shows an example in-vehicle computing system in accordance with one or more embodiments of the present disclosure.

FIG. 2 shows a block diagram of an in-vehicle computing system 200 configured and/or integrated inside vehicle 201. In-vehicle computing system 200 may be an example of in-vehicle computing system 109 of FIG. 1 and/or may perform one or more of the methods described herein in some embodiments. In some examples, the in-vehicle computing system may be a vehicle infotainment system configured to provide information-based media content (audio and/or visual media content, including entertainment content, navigational services, etc.) to a vehicle user to enhance the operator's in-vehicle experience. The vehicle infotainment system may include, or be coupled to, various vehicle systems, sub-systems, hardware components, as well as software applications and systems that are integrated in, or integratable into, vehicle 201 in order to enhance an in-vehicle experience for a driver and/or a passenger.

In-vehicle computing system 200 may include one or more processors including an operating system processor 214 and an interface processor 220. Operating system processor 214 may execute an operating system on the in-vehicle computing system, and control input/output, display, playback, and other operations of the in-vehicle computing system. Interface processor 220 may interface with a vehicle control system 230 via an inter-vehicle system communication module 222.

Inter-vehicle system communication module 222 may output data to other vehicle systems 231 and vehicle control elements 261, while also receiving data input from other vehicle components and systems 231, 261, e.g. by way of vehicle control system 230. When outputting data, inter-vehicle system communication module 222 may provide a signal via a bus corresponding to any status of the vehicle, the vehicle surroundings, or the output of any other information source connected to the vehicle. Vehicle data outputs may include, for example, analog signals (such as current velocity), digital signals provided by individual information sources (such as clocks, thermometers, location sensors such as Global Positioning System [GPS] sensors, etc.), digital signals propagated through vehicle data networks (such as an engine controller area network [CAN] bus through which engine related information may be communicated, a climate control CAN bus through which climate control related information may be communicated, and a multimedia data network through which multimedia data is communicated between multimedia components in the vehicle). For example, the in-vehicle computing system may retrieve from the engine CAN bus the current speed of the vehicle estimated by the wheel sensors, a power state of the vehicle via a battery and/or power distribution system of the vehicle, an ignition state of the vehicle, etc. In addition, other interfacing means such as Ethernet may be used as well without departing from the scope of this disclosure.

A non-volatile storage device 208 may be included in in-vehicle computing system 200 to store data such as instructions executable by processors 214 and 220 in non-volatile form. The storage device 208 may store application data to enable the in-vehicle computing system 200 to run an application for connecting to a cloud-based server and/or collecting information for transmission to the cloud-based server. The application may retrieve information gathered by vehicle systems/sensors, input devices (e.g., user interface 218), devices in communication with the in-vehicle computing system (e.g., a mobile device connected via a Bluetooth link), etc. In-vehicle computing system 200 may further include a volatile memory 216. Volatile memory 216 may be random access memory (RAM). Non-transitory storage devices, such as non-volatile storage device 208 and/or volatile memory 216, may store instructions and/or code that, when executed by a processor (e.g., operating system processor 214 and/or interface processor 220), controls the in-vehicle computing system 200 to perform one or more of the actions described in the disclosure.

A microphone 202 may be included in the in-vehicle computing system 200 to receive voice commands from a user, to measure ambient noise in the vehicle, to determine whether audio from speakers of the vehicle is tuned in accordance with an acoustic environment of the vehicle, etc. A speech processing unit 204 may process voice commands, such as the voice commands received from the microphone 202. In some embodiments, in-vehicle computing system 200 may also be able to receive voice commands and sample ambient vehicle noise using a microphone included in an audio system 232 of the vehicle.

One or more additional sensors may be included in a sensor subsystem 210 of the in-vehicle computing system 200. For example, the sensor subsystem 210 may include a camera, such as a rear view camera for assisting a user in parking the vehicle and/or a cabin camera for identifying a user (e.g., using facial recognition and/or user gestures). Sensor subsystem 210 of in-vehicle computing system 200 may communicate with and receive inputs from various vehicle sensors and may further receive user inputs. For example, the inputs received by sensor subsystem 210 may include transmission gear position, transmission clutch position, gas pedal input, brake input, transmission selector position, vehicle speed, engine speed, mass airflow through the engine, ambient temperature, intake air temperature, etc., as well as inputs from climate control system sensors (such as heat transfer fluid temperature, antifreeze temperature, fan speed, passenger compartment temperature, desired passenger compartment temperature, ambient humidity, etc.), an audio sensor detecting voice commands issued by a user, a fob sensor receiving commands from and optionally tracking the geographic location/proximity of a fob of the vehicle, etc. While certain vehicle system sensors may communicate with sensor subsystem 210 alone, other sensors may communicate with both sensor subsystem 210 and vehicle control system 230, or may communicate with sensor subsystem 210 indirectly via vehicle control system 230. A navigation subsystem 211 of in-vehicle computing system 200 may generate and/or receive navigation information such as location information (e.g., via a GPS sensor and/or other sensors from sensor subsystem 210), route guidance, traffic information, point-of-interest (POI) identification, and/or provide other navigational services for the driver.

External device interface 212 of in-vehicle computing system 200 may be coupleable to and/or communicate with one or more external devices 240 located external to vehicle 201. While the external devices are illustrated as being located external to vehicle 201, it is to be understood that they may be temporarily housed in vehicle 201, such as when the user is operating the external devices while operating vehicle 201. In other words, the external devices 240 are not integral to vehicle 201. The external devices 240 may include a mobile device 242 (e.g., connected via a Bluetooth, NFC, WIFI direct, or other wireless connection) or an alternate Bluetooth-enabled device 252. Mobile device 242 may be a mobile phone, smart phone, wearable devices/sensors that may communicate with the in-vehicle computing system via wired and/or wireless communication, or other portable electronic device(s). Other external devices include external services 246. For example, the external devices may include extra-vehicular devices that are separate from and located externally to the vehicle. Still other external devices include external storage devices 254, such as solid-state drives, pen drives, USB drives, etc. External devices 240 may communicate with in-vehicle computing system 200 either wirelessly or via connectors without departing from the scope of this disclosure. For example, external devices 240 may communicate with in-vehicle computing system 200 through the external device interface 212 over network 260, a universal serial bus (USB) connection, a direct wired connection, a direct wireless connection, and/or other communication link.

The external device interface 212 may provide a communication interface to enable the in-vehicle computing system to communicate with mobile devices associated with contacts of the driver. For example, the external device interface 212 may enable phone calls to be established and/or text messages (e.g., SMS, MMS, etc.) to be sent (e.g., via a cellular communications network) to a mobile device associated with a contact of the driver. The external device interface 212 may additionally or alternatively provide a wireless communication interface to enable the in-vehicle computing system to synchronize data with one or more devices in the vehicle (e.g., the driver's mobile device) via WIFI direct, as described in more detail below.

One or more applications 244 may be operable on mobile device 242. As an example, mobile device application 244 may be operated to aggregate user data regarding interactions of the user with the mobile device. For example, mobile device application 244 may aggregate data regarding music playlists listened to by the user on the mobile device, telephone call logs (including a frequency and duration of telephone calls accepted by the user), positional information including locations frequented by the user and an amount of time spent at each location, etc. The collected data may be transferred by application 244 to external device interface 212 over network 260. In addition, specific user data requests may be received at mobile device 242 from in-vehicle computing system 200 via the external device interface 212. The specific data requests may include requests for determining where the user is geographically located, an ambient noise level and/or music genre at the user's location, an ambient weather condition (temperature, humidity, etc.) at the user's location, etc. Mobile device application 244 may send control instructions to components (e.g., microphone, amplifier etc.) or other applications (e.g., navigational applications) of mobile device 242 to enable the requested data to be collected on the mobile device or requested adjustment made to the components. Mobile device application 244 may then relay the collected information back to in-vehicle computing system 200.

Likewise, one or more applications 248 may be operable on external services 246. As an example, external services applications 248 may be operated to aggregate and/or analyze data from multiple data sources. For example, external services applications 248 may aggregate data from one or more social media accounts of the user, data from the in-vehicle computing system (e.g., sensor data, log files, user input, etc.), data from an internet query (e.g., weather data, POI data), etc. The collected data may be transmitted to another device and/or analyzed by the application to determine a context of the driver, vehicle, and environment and perform an action based on the context (e.g., requesting/sending data to other devices).

Vehicle control system 230 may include controls for controlling aspects of various vehicle systems 231 involved in different in-vehicle functions. These may include, for example, controlling aspects of vehicle audio system 232 for providing audio entertainment to the vehicle occupants, aspects of climate control system 234 for meeting the cabin cooling or heating needs of the vehicle occupants, as well as aspects of telecommunication system 236 for enabling vehicle occupants to establish telecommunication linkage with others.

Audio system 232 may include one or more acoustic reproduction devices including electromagnetic transducers such as speakers. Vehicle audio system 232 may be passive or active such as by including a power amplifier. In some examples, in-vehicle computing system 200 may be the only audio source for the acoustic reproduction device or there may be other audio sources that are connected to the audio reproduction system (e.g., external devices such as a mobile phone). The connection of any such external devices to the audio reproduction device may be analog, digital, or any combination of analog and digital technologies.

Climate control system 234 may be configured to provide a comfortable environment within the cabin or passenger compartment of vehicle 201. Climate control system 234 includes components enabling controlled ventilation such as air vents, a heater, an air conditioner, an integrated heater and air-conditioner system, etc. Other components linked to the heating and air-conditioning setup may include a windshield defrosting and defogging system capable of clearing the windshield and a ventilation-air filter for cleaning outside air that enters the passenger compartment through a fresh-air inlet.

Vehicle control system 230 may also include controls for adjusting the settings of various vehicle controls 261 (or vehicle system control elements) related to the engine and/or auxiliary elements within a cabin of the vehicle, such as steering wheel controls 262 (e.g., steering wheel-mounted audio system controls, cruise controls, windshield wiper controls, headlight controls, turn signal controls, etc.), instrument panel controls, microphone(s), accelerator/brake/clutch pedals, a gear shift, door/window controls positioned in a driver or passenger door, seat controls, cabin light controls, audio system controls, cabin temperature controls, etc. Vehicle controls 261 may also include internal engine and vehicle operation controls (e.g., engine controller module, actuators, valves, etc.) that are configured to receive instructions via the CAN bus of the vehicle to change operation of one or more of the engine, exhaust system, transmission, and/or other vehicle system. The control signals may also control audio output at one or more speakers of the vehicle's audio system 232. For example, the control signals may adjust audio output characteristics such as volume, equalization, audio image (e.g., the configuration of the audio signals to produce audio output that appears to a user to originate from one or more defined locations), audio distribution among a plurality of speakers, etc. Likewise, the control signals may control vents, air conditioner, and/or heater of climate control system 234. For example, the control signals may increase delivery of cooled air to a specific section of the cabin.

Control elements positioned on an outside of a vehicle (e.g., controls for a security system) may also be connected to computing system 200, such as via communication module 222. The control elements of the vehicle control system may be physically and permanently positioned on and/or in the vehicle for receiving user input. In addition to receiving control instructions from in-vehicle computing system 200, vehicle control system 230 may also receive input from one or more external devices 240 operated by the user, such as from mobile device 242. This allows aspects of vehicle systems 231 and vehicle controls 261 to be controlled based on user input received from the external devices 240.

In-vehicle computing system 200 may further include an antenna 206. Antenna 206 is shown as a single antenna, but may comprise one or more antennas in some embodiments. The in-vehicle computing system may obtain broadband wireless internet access via antenna 206, and may further receive broadcast signals such as radio, television, weather, traffic, and the like. The in-vehicle computing system may receive positioning signals such as GPS signals via one or more antennas 206. The in-vehicle computing system may also receive wireless commands via RF such as via antenna (s) 206 or via infrared or other means through appropriate receiving devices. In some embodiments, antenna 206 may be included as part of audio system 232 or telecommunication system 236. Additionally, antenna 206 may provide AM/FM radio signals to external devices 240 (such as to mobile device 242) via external device interface 212.

One or more elements of the in-vehicle computing system 200 may be controlled by a user via user interface 218. User interface 218 may include a graphical user interface presented on a touch screen, such as touch screen 108 of FIG. 1, and/or user-actuated buttons, switches, knobs, dials, sliders, etc. For example, user-actuated elements may include steering wheel controls, door and/or window controls, instrument panel controls, audio system settings, climate control system settings, and the like. A user may also interact with one or more applications of the in-vehicle computing system 200 and mobile device 242 via user interface 218. In addition to receiving a user's vehicle setting preferences on user interface 218, vehicle settings selected by in-vehicle control system may be displayed to a user on user interface 218. Notifications and other messages (e.g., received messages), as well as navigational assistance, may be displayed to the user on a display of the user interface. User preferences/information and/or responses to presented messages may be performed via user input to the user interface.

Figure 3:
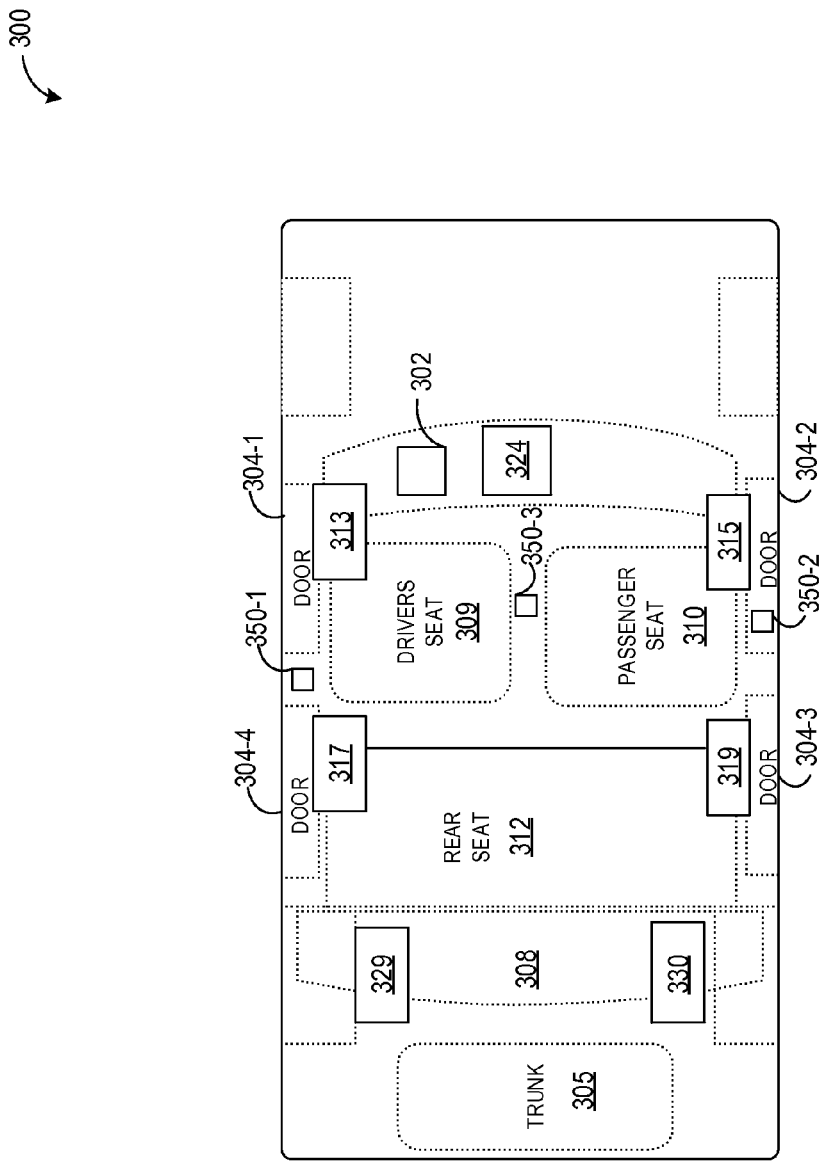
FIG. 3 shows an example sound processing system in a vehicle in accordance with one or more embodiments of the present disclosure.

FIG. 3 is a block diagram of a vehicle 300 that includes an example audio or sound processing system (AS) 302, which may include any or a combination of the sound processing systems and methods described below. The vehicle 300 may be an example of vehicle 102 of FIG. 1. The vehicle 300 includes doors 304, a driver seat 309, a passenger seat 310, and a rear seat 311. While a four-door vehicle is shown including doors 304-1, 304-2, 304-3, and 304-4, the audio system (AS) 102 may be used in vehicles having more or fewer doors. The vehicle 300 may be an automobile, truck, boat, or the like. Although only one rear seat is shown, larger vehicles may have multiple rows of rear seats. Smaller vehicles may have only one or more seats. While a particular example configuration is shown, other configurations may be used including those with fewer or additional components.

The audio system 302 (which may include an amplifier and/or other audio processing device for receiving, processing, and/or outputting audio to one or more speakers of the vehicle) may improve the spatial characteristics of surround sound systems. The audio system 302 supports the use of a variety of audio components such as radios, COs, DVDs, their derivatives, and the like. The audio system 302 may use 2-channel source material such as direct left and right, 5.1 channel, 6.2 channel, 7 channel, 12 channel and/or any other source materials from a matrix decoder digitally encoded/decoded discrete source material, and the like. The amplitude and phase characteristics of the source material and the reproduction of specific sound field characteristics in the listening environment both play a key role in the successful reproduction of a surround sound field.

The audio system 302 may improve the reproduction of a surround sound field by controlling the amplitude, phase, and mixing ratio between discrete and passive decoder surround signals and/or the direct two-channel output signals. The amplitude, phase, and mixing ratios may be controlled between the discrete and passive decoder output signals. The spatial sound field reproduction may be improved for all seating locations by re-orientation of the direct, passive, and active mixing and steering parameters, especially in a vehicle environment. The mixing and steering ratios as well as spectral characteristics may be adaptively modified as a function of the noise and other environmental factors. In a vehicle, information from the data bus, microphones, and other transduction devices may be used to control the mixing and steering parameters.

The vehicle 300 has a front center speaker (CTR speaker) 324, a left front speaker (LF speaker) 313, a right front speaker (RF speaker) 315, and at least one pair of surround speakers. The surround speakers may be a left side speaker (LS speaker) 317 and a right side speaker (RS speaker) 319, a left rear speaker (LR speaker) 329 and a right rear speaker (RR speaker) 330, or a combination of speaker sets. Other speaker sets may be used. While not shown, one or more dedicated subwoofers or other drivers may be present. Possible subwoofer mounting locations include the trunk 305, below a seat, or the rear shelf 308. The vehicle 300 may also have one or more microphones 350 mounted in the interior.

Each CTR speaker, LF speaker, RF speaker, LS speaker, RS speaker, LR speaker, and RR speaker may include one or more transducers of a predetermined range of frequency response such as a tweeter, a mid-range, or a woofer. The tweeter, mid-range, or woofer may be mounted adjacent to each other in essentially the same location or in different locations. For example, the LF speaker 313 may be a tweeter located in door 304-1 or elsewhere at a height roughly equivalent to a side mirror or higher. The RF speaker 315 may have a similar arrangement to LF speaker 313 on the right side of the vehicle (e.g., in door 304-2).

The LR speaker 329 and the RR speaker 330 may each be a woofer mounted in the rear shelf 308. The CTR speaker 324 may be mounted in the front dashboard 307, in the roof, on or near the rear-view mirror, or elsewhere in the vehicle 300. In other examples, other configurations of loudspeakers with other frequency response ranges are possible. In some embodiments, additional speakers may be added to an upper pillar in the vehicle to enhance the height of the sound image. For example, an upper pillar may include a vertical or near-vertical support of a car's window area. In some examples, the additional speakers may be added to an upper region of an "A" pillar toward a front of the vehicle.

Figure 4:
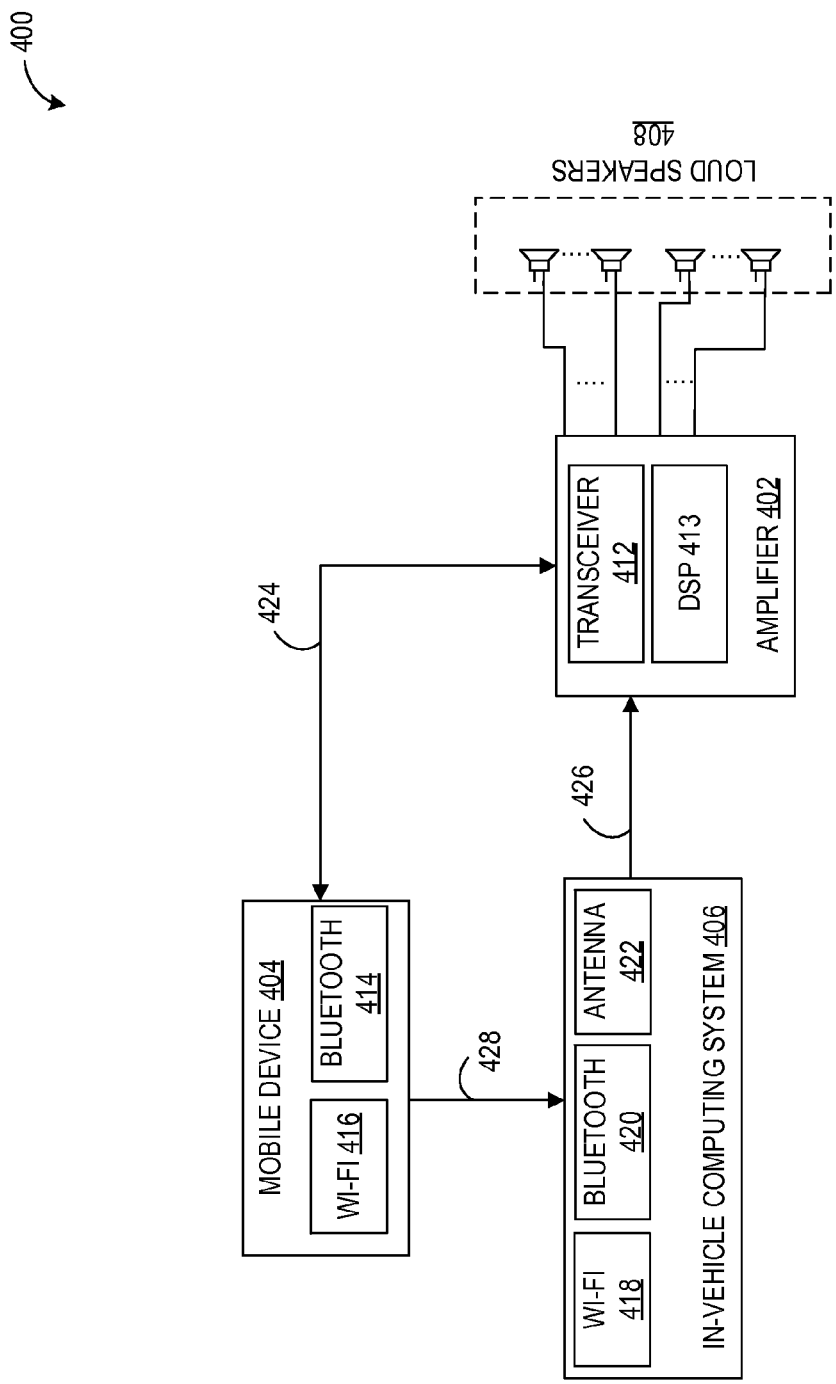
FIG. 4 shows a block diagram of an example vehicle audio customization system in accordance with one or more embodiments of the present disclosure.

FIG. 4 shows a block diagram of an example vehicle audio customization 400 including an amplifier 402, a mobile device 404, and an in-vehicle computing system (also referred to as a head unit) 406. The amplifier 402 may be an example of audio system 302 of FIG. 2, and may perform one or methods described herein in some embodiments. The mobile device 404 may be an example of mobile devices 128 of FIG. 1, and mobile devices 242 of FIG. 3, and may perform one or methods described herein in some embodiments. In-vehicle computing system 406 may be an example of in-vehicle computing system 109 of FIG. 1 and in-vehicle computing system 200 of FIG. 2, and/or may perform one or more of the methods described herein in some embodiments. In some examples, one or more of the mobile device and the in-vehicle computing system may be configured to adjust audio settings of the amplifier to enhance the operator's in-vehicle experience.

The amplifier 402 may be configured to produce audio output on audio channels. The amplifier 402 may process and amplify the audio signals and use the amplified audio signals to drive transducers, such as loudspeakers 408, to produce an audio output that maximizes the amplitude and/or frequency range of the audio output in the vehicle. The amplifier 402 may output power into different channels (12, for example) capable of powering several loudspeakers (e.g., front center speaker 324, LF speaker 313, RF speaker 315 of FIG. 3, surround speakers, etc.). As such, the amplifier 402 may include a digital signal processor (DSP) 413 controlling various parameters affecting the sound system's acoustic output. The DSP may process the audio signals, the processing including one or more of filtering the signals, adding delay to speakers, adding reverberation, adjusting image centering, adjusting surround sound, etc. The DSP tuning of the amplifier may be programmed into the amplifier, and the user may perform further fine tuning such as adjusting bass, treble, balance, and fade to personalize the system to their audio tastes.

In an example embodiment, the amplifier tuning via the DSP may be performed based on a signal from a mobile device 404. As described earlier, the mobile device 404 may communicate (e.g., transmit and/or receive data) via one or more wireless communication links 424 and 428 for connecting to one or more devices. The mobile device 404 may include one or more transceivers, such as WIFI transceiver 416 and/or Bluetooth transceiver 414. Some additional or alternative examples of communication interfaces for inclusion in the mobile device 404 may include one or more physical devices, such as antenna(s) or port(s) coupled to data lines for carrying transmitted or received data, as well as one or more modules/drivers for operating the physical devices in accordance with other devices in the mobile device. For example, the communication link 424 may transmit control signals to and from the mobile device to the amplifier 402. Similarly, the communication link 428 may send and receive signals from the in-vehicle computing system 406, for example. Further, a communication link 426 may transmit a signal from the in-vehicle computing system 406 to the amplifier 402. The in-vehicle computing system 406 may further include WIFI transceiver 408, Bluetooth transceiver 420, and antenna 422. Furthermore, the amplifier 402 may also include a transceiver 412. An example of the transceiver 412 may include a Bluetooth or other proximity-based wireless transceiver.

The communication links 424, 426, and 428 may be wireless (e.g., via BLUETOOTH, WIFI, WIFI direct Near-Field Communication [NFC], cellular connectivity, etc.) and configured to provide two-way communication between the mobile device 404 and the amplifier 402. In some embodiments, the communication links 424, 426, and 428 between the mobile device 404 and the amplifier may be wired (e.g., via Universal Serial Bus [USB], Mobile High-Definition Link [MHL], High-Definition Multimedia Interface [HDMI], Ethernet, etc.).

The mobile device 404 may send requests to make adjustments to the amplifier setting via a user interface. For example, a user may provide input to the user interface indicating a preference for adjusting one or more audio settings, and a control signal relating to the adjustments to the audio settings may be sent via the communication interface of the mobile device (e.g., WIFI and/or Bluetooth). The adjustments may include signals to a DSP of the amplifier 402 for controlling various parameters affecting the sound system's acoustic output. For example, the user may request notch filtering of the amplifier's output. A notch filter may be used to reduce hum components in the audio output (e.g., reducing 50 Hz and 60 Hz components). As another example, the user may request adjusting time delay settings between the different channels to adjust the surround sound system settings. By adjusting the time delay between front and rear speakers, for example, sounds from each of the speakers may be configured to arrive at the listener's ear at the same time and may enhance overall audio output. More examples of user requested adjustments may include adding reverberation, selecting reverberation types, adjusting image centering, selecting surround sound algorithms, etc. The amplifier 402 may have thresholds set for each of the parameters, and the requests that fall within the threshold may be accepted by the amplifier, for example. For example, bass boost of greater than a threshold (e.g., bass output at lower than 60 Hz, for example) may damage the speakers. In some embodiments, thresholds may be based on a combination of parameters. For example, bass may be more damaging to a speaker when played at a higher volume. Accordingly, the bass boost described above may be rated for audio played back at a first threshold volume (e.g., 12 dB). As the volume increases, the allowed bass output frequency may increase (e.g., further reducing the range of bass playable by the speaker). The user may request the adjustments via an interface, such as user interface 500 shown in FIG. 5.

Figure 5:
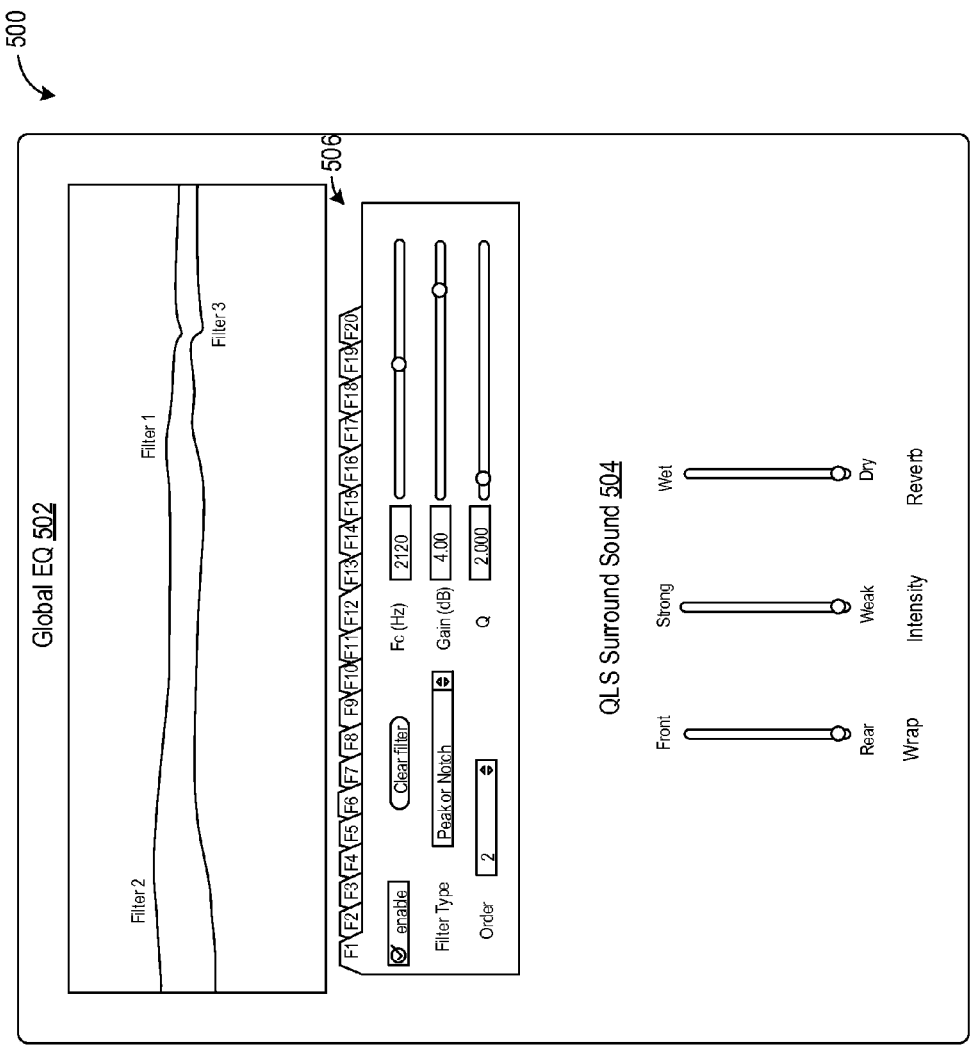
FIG. 5 shows an example user interface for a mobile device in accordance with one or more embodiments of the present disclosure.

FIG. 5 shows an example interface for a mobile device or other computing device for providing audio adjustment. For example, user interface 500 may be displayed on a display of mobile device 404 of FIG. 4 and may accept input from a user (e.g., touch input provided to the display of the mobile device). The user interface 500 may include one or more regions, such as regions 502, 504 and 506, which may be displayed simultaneously on the same screen. In other examples, one or more of the regions (e.g., one or more of regions 502, 504, and 506) may be displayed on separate screens between which the user may navigate. The region 506 may allow the user to enable filters, such as peak or notch filter, pick the filtering order, select one or more of filtering frequency, gain, and quality factor, and/or provide input regarding any suitable parameter of the filter. The user may have the option of selecting these parameters for several filters (e.g., filters F1 to F20 in the illustrated example). By applying different filters and by adjusting the properties of these filters, the user may be able to enhance tonal equalization (also known as parametric equalizer EQ). EQ is a form of tone control via parameters such as bass, treble, etc. By adjusting Frequency, Gain, and Bandwidth Q of an acoustic filter (e.g., via input to region 506), it may be possible to adjust the EQ of the amplifier. The EQ allows flexibility in choosing a certain frequency (2120 Hz, for example), setting gain (4 dB, for example), and choosing the bandwidth Q (2, for example), thereby enhancing the quality of the notes produced by the amplifier. A notch filter may sometimes be used to "cut" the response to a narrow band of frequencies (in some scenarios, a very narrow band such as a single note, for example). It may be possible to select the type of filtering to be applied by selecting the filter type in the panel region 506, for example. Region 502 may display a graphical representation of the filters being applied as configured in region 506.

In addition, the user may make adjustments to the surround sound selection at region 504. For example, the user may be able to adjust the intensity of the surround sound by adjusting slider "Intensity". When set closer to "Weak", the intensity of the surround sound is lower than when the slider is set closer to "Strong". Similarly, by adjusting slider "Reverb", the user can adjust the reverberations. "Dry" indicates outputting audio without any reverberations added while "Wet" indicates outputting audio with reverberations added (e.g., when set to their maximum respective settings). "Reverb" may be used to control the front to back placement of audio signal mix. The dryer the track (less reverb) the more forward it will be in the mix. Conversely, increasing the amount of reverb (making it "wetter") will send a track towards the back in the audio mix. It is to be understood that the illustrated user interface elements are exemplary in nature, and any suitable interface for controlling the various audio settings may be provided in any suitable configuration. For example, where sliders are shown, other actuatable elements such as buttons, knobs, menus, text boxes, and/or other user interface elements for accepting user input may be included. Furthermore, although the illustrated example provides a displayed user interface, it is to be understood that one or more of the adjustment mechanisms may be associated with a hardware input device. For example, a slider of the user interface may be actuated by touching the slider bar and/or moving a finger along the slider bar and/or may be actuated by rotating a physical knob or pressing an up/down button to adjust the associated setting. The user interface elements for requesting adjustments to the audio system and/or amplifier may be actuatable to request continuously variable adjustments between a maximum and minimum value (e.g., adjustments that are not limited to discrete levels and/or adjustments that are adjustable to an integer or decimal value).

Returning to FIG. 4, the user-requested adjustments to the amplifier settings may be communicated to the amplifier via the communication link 424. Once the adjustments are made to the amplifier, the settings may be transmitted to the mobile device 404, where the settings may be saved locally on the mobile device 404 and made available for retrieval in the future. Furthermore, the settings may be saved under the user profile. Different users may save their preferred amplifier settings in different user profiles in the amplifier. In this way, a user may recall his user profile, and all the adjustments that he/she has saved may be applied to the amplifier and/or presented for selection (and selectively applied to the amplifier based on user selection).

As described above, the mobile device 404 is also capable of communicating with the in-vehicle computing system 406 via communication link 428. The user may be able to communicate one or more of his/her preferred amplifier settings from the mobile device 404 to the amplifier 402 via the in-vehicle computing system 406 in some examples. For example, the user may be able to adjust the volume of the amplifier by adjusting a volume slider in the user interface. Increasing or decreasing volume requests may be sent from the mobile device 404 to the in-vehicle computing device 406 via the communication link 428. Upon receiving the request from the mobile device 404, the in-vehicle computing device may then communicate via link 426 to the amplifier an increase/decrease audio control signal. The amplifier may adjust operation to output an audio signal to the loudspeakers 408 having a higher/lower volume (e.g., amplitude) based on the control signal, thereby increasing/decreasing volume of the loudspeakers 408 coupled to the amplifier 402. Other examples of adjustments made to the amplifier 402 by the in-vehicle computing system, 406 include tone, faders, turning surround on/off, and/or any other settings configurable by the mobile device (e.g., via the user interface of the mobile device). The mobile device and/or the in-vehicle computing system may translate the settings adjustments made via the input to the user interface on the mobile device into control commands that may be transmitted to the amplifier via the in-vehicle computing system to effect the requested audio adjustments.

Figure 6:
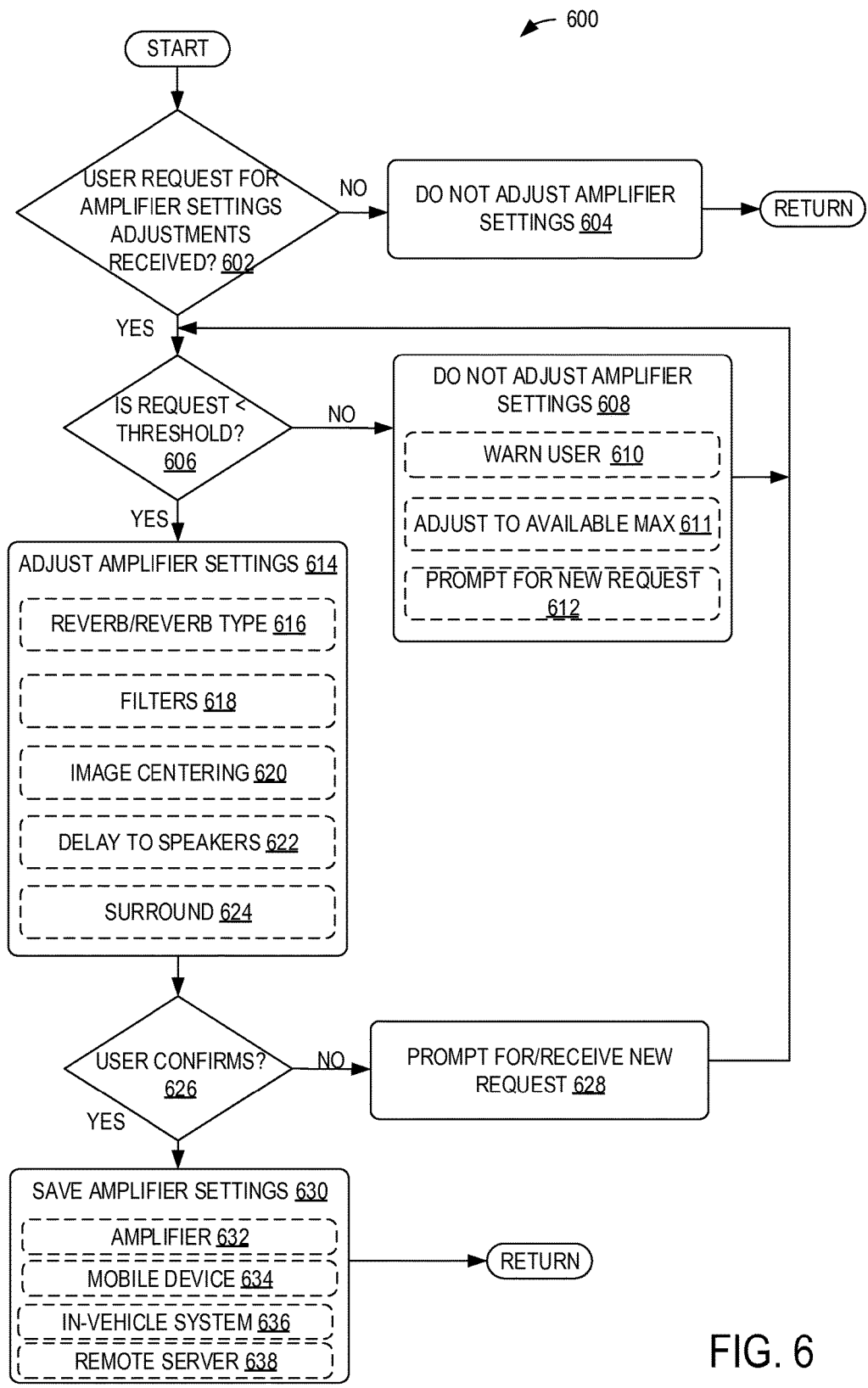
FIG. 6 is a flow chart of an example method for adjusting amplifier settings based on a user request in accordance with one or more embodiments of the present disclosure.

Turning to FIG. 6, the figure shows an example method 600 for adjusting amplifier settings based on a user request (e.g., received via a user interface of the mobile device). For example, method 600 may be performed by the DSP of the amplifier (e.g., DSP 413 of amplifier 402 of FIG. 4) and/or by a mobile device (e.g., mobile device 404 of FIG. 4). At 602, the mobile device and/or the amplifier may determine if a user request to adjust amplifier settings was received. The user may request the adjustments by adjusting a user interface on a mobile device, and the request from the mobile device may be communicated to the amplifier via wireless connection, for example (e.g., a direct wireless connection between the mobile device and the amplifier, without any intervening devices and/or without sending the signal through the in-vehicle computing system). In other examples, the request may be forwarded from the mobile device to the amplifier via the in-vehicle computing system and/or another intervening computing device (e.g., a network switch and/or server device). Examples of user requests include one or more of adding reverberation, choosing reverberation type, applying a notch filter, adjusting image centering, adding delay to rear speakers, adjusting surround algorithm, etc. For example, the user may request to add reverberation to the audio output by the loudspeakers, where reverberation is the echo effect produced collectively from the plurality of speakers. Furthermore, the user may select the type of reverberation to add, for example. Various types of reverberation include, plate, spring, etc., and may be selectable via a displayed menu option on the mobile device. If there is no request from the user (e.g., "NO" at 602), the method proceeds to 604 where the amplifier settings are not adjusted and the method returns.

However, if the user request to adjust amplifier settings is received (e.g., "YES" at 602), the method proceeds to 606 where the amplifier and/or the mobile device determines if the received request is less than a threshold. The threshold may be one or more predetermined limits that are set in the amplifier to reduce damage to the amplifier and the loudspeakers connected to the amplifier. If the user requested multiple settings or settings adjustments, each setting or adjustment may have an associated threshold to which it is compared.

If any one of the parameter adjustments is higher than the predetermined thresholds, then the method proceeds to 608 where the amplifier setting(s) corresponding to those adjustment(s) is not adjusted or is not adjusted the requested amount. Furthermore, the user may be warned that the requested adjustments may damage the amplifier and/or the connected loudspeakers, as indicated at 610. In some examples, the amplifier may adjust the requested audio settings up to a maximum or down to a minimum allowable setting (e.g., up to the threshold that the setting did not meet), as indicated at 611. Accordingly, the mobile device and/or the amplifier may compare the requested adjustment to a threshold associated with that adjustment and issue the warning when the requested adjustment exceeds the threshold. The warning issued at 610 may additionally or alternatively include a notice that the request exceeded the threshold, a notice that the associated settings were only adjusted to partially meet the user's request, and an identification of the threshold that was exceeded that may be communicated to the user. The user may then be prompted to change the adjustment request at 612. Any new adjustment request may be received, then re-evaluated at 606.

If any one of the requested adjustments to the parameters is within the predetermined threshold (e.g., "YES" at 606), then the method proceeds to 614 where the amplifier settings for those requested adjustments are adjusted based on the request. For example, reverberation may be added, and a reverberation type desired may be applied at 616. Filters, including notch filter, band-pass filter, etc., may be applied to the amplifier at 618. Image centering may be applied at 620, and delay to the speakers may be applied to 622. Furthermore, adjustments to surround sound may be implemented at 624. The surround sound adjustments may be applied via a surround sound algorithm executed by the DSP of the amplifier, for example. For example, the surround sound adjustments may include adjusting a perceived location of the output audio by adjusting an amplitude, frequency, and/or other parameter of audio output at each of the loudspeakers.

Once the user-requested amplifier adjustments have been implemented, the method proceeds to 626, where the mobile device and/or amplifier determines whether the user approves of/confirms the sound effects achieved with the adjustments that he/she requested. If the user is not satisfied with the acoustic effect achieved with the amplifier adjustments, then method proceeds to 628 where the mobile device may prompt the user for a new request, and the user may input the new request via the user interface on the mobile device. After receiving a new request, the method may then return to 606 where the new request may again be checked as described above. Conversely, if the user is satisfied with the acoustic effect, then the method proceeds to 630 where the amplifier settings may be saved. The amplifier settings corresponding to a specific user may be saved under the specific user profile, in one or more of the amplifier (at 632), the mobile device (at 634), an in-vehicle computing system (at 636), and a remote server (at 638) and the method returns.

The description of embodiments has been presented for purposes of illustration and description. Suitable modifications and variations to the embodiments may be performed in light of the above description or may be acquired from practicing the methods. For example, unless otherwise noted, one or more of the described methods may be performed by a suitable device and/or combination of devices, such as an in-vehicle computing system (e.g., in-vehicle computing system 406), an amplifier (e.g., amplifier 402), and/or a mobile device (e.g., mobile device 404) described with reference to FIGS. 1-5. The methods may be performed by executing stored instructions with one or more logic devices (e.g., processors) in combination with one or more additional hardware elements, such as storage devices, memory, hardware network interfaces/antennas, switches, actuators, clock circuits, etc. The described methods and associated actions may also be performed in various orders in addition to the order described in this application, in parallel, and/or simultaneously. The described systems are exemplary in nature, and may include additional elements and/or omit elements. The subject matter of the present disclosure includes all novel and non-obvious combinations and sub-combinations of the various systems and configurations, and other features, functions, and/or properties disclosed.

The systems and methods described above also provide for a computing device for customization of an audio system of a vehicle, the computing device comprising a display configured to present a user interface, a processor, and a storage device storing instructions executable by the processor to generate the user interface for presentation via the display, receive user input to the user interface requesting one or more adjustments to an audio system, the one or more adjustments including instructions to tune an amplifier of the vehicle by adjusting digital signal processing (DSP) settings of the amplifier, transmit the one or more requested adjustments to a communication interface of the amplifier of the vehicle, the adjusted DSP settings being stored in the amplifier and retrievable by the computing device. In a first example, the computing device may additionally or alternatively include the computing device wherein the one or more adjustments comprise a first set of adjustments, the instructions being further executable to receive user input to the user interface requesting a second set of adjustments different from the first set of adjustments, and transmit the second set of adjustments to an in-vehicle computing system for forwarding to the amplifier. In a second example, the computing device may optionally include the first example and the computing device wherein the first set of adjustments include adjustments to parameters of one or more of a notch filter, image centering, reverberation, speaker delay, and a sound image indicating a perceived location of surround sound within the vehicle. In a third example, the computing device may optionally include one or both of the first and the second examples and the computing device wherein the second set of adjustments includes adjustments to one or more of bass, treble, balance, and fade of the a loudspeaker output. In a fourth example, the computing device may optionally include one or more of the first through the third examples and the computing device wherein the instructions are further executable to receive, from the communication interface of the amplifier, the stored adjusted DSP settings responsive to a user request, the adjusted DSP settings being stored as a user profile in one or more of the computing device, the amplifier, and a remote server. In a fifth example, the computing device may optionally include one or more of the first through the fourth examples and the computing device wherein the user interface includes user interface elements that are actuatable to request continuously variable adjustments within a maximum and a minimum value for audio parameters. In a sixth example, the computing device may optionally include one or more of the first through the fifth examples and the computing device wherein the user interface includes text boxes for entering a requested value for one or more parameters of a filter applied to an audio signal, the one or more requested adjustments including the requested value for the one or more parameters of the filter. In a seventh example, the computing device may optionally include one or more of the first through the sixth examples and the computing device wherein the instructions are further executable identify or receive from the amplifier an indication that one or more of the requested adjustments exceed a threshold for the amplifier. In an eighth example, the computing device may optionally include one or more of the first through the seventh examples and the computing device wherein the instructions are further executable to, responsive to identifying or receiving the indication, prompt the user for different adjustments.

The systems and methods described above also provide for a method of tuning an amplifier coupled to a vehicle, the amplifier including a communication interface, the method comprising receiving, at the communication interface of the amplifier, input from a mobile device, the input including an identification of requested adjustments to one or more digital signal processing (DSP) settings of the amplifier, responsive to receiving the input from the mobile device, for each requested adjustment to a DSP setting, comparing that requested adjustment to an associated threshold for that DSP setting, and adjusting parameters of an audio signal in accordance with each of the requested adjustments to the one or more DSP settings that are within the associated threshold for that DSP setting to form an adjusted audio signal, outputting, from the amplifier, the adjusted audio signal to a plurality of loudspeakers in the vehicle, the adjusted audio signal driving the plurality of loudspeakers, and storing the adjusted DSP settings in the amplifier. In a first example, the method may additionally or alternatively include the method wherein the input from the mobile device is received via a direct wireless connection between the mobile device and the amplifier. In a second example, the method may optionally include the first example and the method wherein the input from the mobile device is received via an in-vehicle computing system communicatively coupled to the mobile device and the amplifier. In a third example, the method may optionally include one or both of the first and the second examples and the method wherein the input includes requested adjustments to parameters of one or more of a notch filter, image centering, reverberation, speaker delay, and a sound image indicating a perceived location of surround sound within the vehicle. In a fourth example, the method may optionally include one or more of the first through the third examples and the method further comprising transmitting the stored adjusted DSP settings to the mobile device responsive to receiving a request for the stored adjusted DSP settings from the mobile device. In a fifth example, the method may optionally include one or more of the first through the fourth examples and the method further comprising, for each requested adjustment to a DSP setting that is not within the associated threshold for that DSP setting, adjusting that DSP setting to the threshold and transmitting an error to the mobile device indicating that the requested adjustment was not made. In a sixth example, the method may optionally include one or more of the first through the fifth examples and the method further comprising, for each requested adjustment to a DSP setting that is not within the associated threshold for that DSP setting, not adjusting that DSP setting and transmitting an error to the mobile device indicating that the requested adjustment was not made.

The methods and systems described above also provide for an in-vehicle computing system for a vehicle, the in-vehicle computing system comprising a vehicle system interface communicatively connected to an amplifier of the vehicle, the amplifier connected to plurality of loudspeakers mounted in the vehicle to drive the plurality of loudspeakers, an external device interface communicatively connected to a mobile device, a processor, and a storage device storing instructions executable by the processor to receive an input from the mobile device to perform a set of requested adjustments to one or more associated DSP settings of the amplifier via the mobile device to tune the amplifier, for each requested adjustment to an associated DSP setting, comparing that requested adjustment to an associated threshold for that associated DSP setting, and forwarding the requested adjustments to associated DSP settings that are within the associated threshold for that DSP setting to the amplifier, and responsive to determining that one or more of the requested adjustments is not within the threshold for the associated DSP setting, not forwarding the requested adjustments to associated DSP settings that are not within the associated threshold for that DSP setting to the amplifier and transmitting a notice to the mobile device that the requested adjustments that were not within the threshold were not made. In a first example, the in-vehicle computing system additionally or alternatively includes the in-vehicle computing system wherein the in-vehicle computing system is communicatively coupled to the amplifier via a wired connection. In a second example, the in-vehicle computing system optionally includes the first example and the in-vehicle computing system wherein the set of adjustments include adjusting one or more parameters, the parameters including parameters for a notch filter, image centering, reverberation, reverberation types, a delay to a set of speakers, and a surround algorithm. In a third example, the in-vehicle computing system optionally includes one or both of the first and the second examples, and the in-vehicle computing system wherein the set of adjustments is a first set of adjustments, the instructions further executable to receive user input via a user interface of the in-vehicle computing system requesting a second set of adjustments, the second set of adjustments requesting changes to different parameters than the first set of adjustments and the second set of adjustments including adjustments to control one or more of volume, tone, faders, and balance via the plurality of loudspeakers.

As used in this application, an element or step recited in the singular and proceeded with the word "a" or "an" should be understood as not excluding plural of said elements or steps, unless such exclusion is stated. Furthermore, references to "one embodiment" or "one example" of the present disclosure are not intended to be interpreted as excluding the existence of additional embodiments that also incorporate the recited features. The terms "first," "second," and "third," etc. are used merely as labels, and are not intended to impose numerical requirements or a particular positional order on their objects. The following claims particularly point out subject matter from the above disclosure that is regarded as novel and non-obvious.

The invention claimed is:
1. A computing device for customization of an audio system of a vehicle, the computing device comprising:
    a display configured to present a user interface;
    a processor; and a storage device storing instructions executable by the processor to:
  generate the user interface for presentation via the display;
  receive user input to the user interface requesting one or more adjustments to the audio system, the one or more adjustments including instructions to tune an amplifier of the vehicle by adjusting digital signal processing (DSP) settings of the amplifier, the user interface being presented separately from the amplifier and the display being separate from the amplifier;
  responsive to identifying or receiving an indication that one or more of the requested adjustments exceed a threshold for the amplifier, present a prompt for different adjustments; and
  transmit the one or more requested adjustments or the different adjustments to a communication interface of the amplifier of the vehicle via a communication link between the computing device and the amplifier, the adjusted DSP settings being stored in the amplifier and retrievable by the computing device.

2. The computing device of claim 1, wherein the one or more adjustments comprise a first set of adjustments, the instructions being further executable to receive user input to the user interface requesting a second set of adjustments different from the first set of adjustments, and transmit the second set of adjustments to an intervening in-vehicle computing system for forwarding to the amplifier, the second set of adjustments being transmitted from the computing device to the amplifier via the in-vehicle computing system.

3. The computing device of claim 2, wherein the first set of adjustments includes adjustments to parameters of one or more of a notch filter, image centering, reverberation, speaker delay, and a sound image indicating a perceived location of surround sound within the vehicle.

4. The computing device of claim 3, wherein the second set of adjustments includes adjustments to one or more of bass, treble, balance, and fade of a loudspeaker output.

5. The computing device of claim 1, wherein the instructions are further executable to receive, from the communication interface of the amplifier, the stored adjusted DSP settings responsive to a user request, the adjusted DSP settings being stored as a user profile in one or more of the computing device, the amplifier, and a remote server.

6. The computing device of claim 1, wherein the user interface includes user interface elements that are actuatable to request continuously variable adjustments within a maximum and a minimum value for audio parameters, and wherein the requested adjustments include adjustments to a surround sound algorithm executed by the amplifier to adjust a perceived location of output audio.

7. The computing device of claim 1, wherein the user interface includes text boxes for entering a requested value for one or more parameters of a filter applied to an audio signal, the one or more requested adjustments including the requested value for the one or more parameters of the filter.

8. The computing device of claim 1, wherein the instructions are further executable to identify or receive from the amplifier the indication that the one or more of the requested adjustments exceed the threshold for the amplifier, and wherein the requested adjustments include adjustments to one or more of a mixing ratio between discrete and passive decoder surround signals and a modification to steering ratios and spectral characteristics of output audio.

9. An in-vehicle computing system for a vehicle, the in-vehicle computing system comprising:
  a vehicle system interface communicatively connected to an amplifier of the vehicle, the amplifier connected to a plurality of loudspeakers mounted in the vehicle to drive the plurality of loudspeakers;
  an external device interface communicatively connected to a mobile device that is separate from the vehicle;
  a processor; and
  a storage device storing instructions executable by the processor to:
    receive a first input from the mobile device to perform a first set of requested adjustments to one or more associated digital signal processing (DSP) settings of the amplifier via the mobile device to tune the amplifier, the first set of requested adjustments including adjusting a first set of parameters;
    receive a second input via a user interface of the in-vehicle computing system requesting a second set of adjustments, the second set of requested adjustments including adjusting a second, different set of parameters;
    for each requested adjustment to an associated DSP setting, comparing that requested adjustment to an associated threshold for that associated DSP setting, and forwarding the requested adjustments to associated DSP settings that are within the associated threshold for that DSP setting to the amplifier; and
    responsive to determining that one or more of the requested adjustments is not within the threshold for the associated DSP setting, not forwarding the requested adjustments to associated DSP settings that are not within the associated threshold for that DSP setting to the amplifier, transmitting a notice to the mobile device that the requested adjustments that were not within the threshold were not made, and outputting a warning to a user of the mobile device associated with the notice.

10. The in-vehicle computing system of claim 9, wherein the in-vehicle computing system is communicatively coupled to the amplifier via a wired connection and wherein the warning includes a prompt to the user to change the one or more of the requested adjustments that are not within the threshold for the associated DSP setting.

11. The in-vehicle computing system of claim 9, wherein the first set of parameters includes parameters for a notch filter, image centering, reverberation, reverberation types, a delay to a set of speakers, and a surround algorithm.

12. The in-vehicle computing system of claim 9, wherein the second set of adjustments includes adjustments to control one or more of volume, tone, faders, and balance via the plurality of loudspeakers.

13. A method of tuning an amplifier using an in-vehicle computing system, the method comprising:
  receiving, at a communication interface of the in-vehicle computing system, input from a device that is spatially separate from the amplifier and the in-vehicle computing system, the input including an identification of requested adjustments to one or more digital signal processing (DSP) settings of the amplifier, the requested adjustments including adjustments to spatial characteristics of a surround sound system; and
  responsive to receiving the input from the device, transmitting, to the amplifier, instructions for adjusting parameters of one or more audio signals for one or more surround sound speakers in accordance with each of the requested adjustments to the one or more DSP settings.

14. The method of claim 13, wherein the requested adjustments include adjustments to a mixing ratio between discrete and passive decoder surround signals.

15. The method of claim 13, wherein the requested adjustments include a modification to steering ratios and spectral characteristics of output audio.

16. The method of claim 13, wherein the surround sound system includes a plurality of vehicle speakers including a selected combination of a right side speaker, a left side speaker, a left rear speaker, and a right rear speaker.

17. The method of claim 13, wherein the requested adjustments include adjustments to a surround sound algorithm executed by the amplifier to adjust a perceived location of output audio.

18. The method of claim 17, wherein the adjustments to adjust a perceived location of the output audio includes adjustments to one or more parameters of the audio output at each loudspeaker in a vehicle.

19. The method of claim 17, wherein the adjustments to spatial characteristics of a surround sound system are included in a first set of adjustments, the method further comprising receiving input at a user interface of the in-vehicle computing system requesting a second, different set of adjustments and transmitting, to the amplifier, instructions for adjusting different parameters of the one or more audio signals in accordance with the second set of adjustments.

20. The method of claim 17, further comprising for each requested adjustment to the spatial characteristics of a surround sound system, comparing the requested adjustment to an associated threshold for the surround system and, for each requested adjustment not within the associated threshold, not forwarding the requested adjustment to the amplifier and presenting a warning indicating that the requested adjustment is not within the associated threshold.

* * * * *